United States Patent [19]
Motonobu et al.

[11] Patent Number: 5,548,503
[45] Date of Patent: Aug. 20, 1996

[54] SNUBBER CIRCUIT FOR SWITCHING POWER SUPPLY

[75] Inventors: Masahiro Motonobu; Kouichi Ueki, both of Saitama, Japan

[73] Assignee: Fuji Electric Co., Ltd., Hino, Japan

[21] Appl. No.: 260,046

[22] Filed: Jun. 16, 1994

[30] Foreign Application Priority Data

Jun. 17, 1993 [JP] Japan .................................. 5-145273
Oct. 29, 1993 [JP] Japan .................................. 5-271077

[51] Int. Cl.$^6$ ........................................................ H02H 7/122
[52] U.S. Cl. ............................................. 363/56; 363/132
[58] Field of Search ................................. 363/55–58, 16, 363/20, 95, 37, 133–134; 361/91, 16

[56] References Cited

U.S. PATENT DOCUMENTS

| | | | |
|---|---|---|---|
| 4,586,118 | 4/1986 | Mihalka | 363/17 |
| 4,792,885 | 12/1988 | Cuman et al. | 363/16 |
| 4,805,080 | 2/1989 | Nieminen | 363/56 |
| 5,077,651 | 12/1991 | Kobayashi et al. | 363/56 |

FOREIGN PATENT DOCUMENTS 2840100 1/1980 Germany .

*Primary Examiner*—Peter S. Wong
*Assistant Examiner*—Aditya Krishnan
*Attorney, Agent, or Firm*—Brumbaugh, Graves, Donohue & Raymond

[57] ABSTRACT

The present invention provides a snubber circuit for a switching power supply that generates rectified direct current power from an inductive load cyclically connected and disconnected by two switching means fed by a direct current power supply. To reduce turn-on and turn-off loss of the switching means and increase switching frequency by reducing power loss in the snubber circuit, the snubber circuit according to the present invention absorbs counter-electromotive force generated during turn-off of the switching means. Turn-on loss of the switching means is reduced because a current from the switching means does not flow through the snubber circuit when the switching means are turned on. Power consumption in the snubber circuit is reduced and energy is efficiently utilized, because energy, stored in the snubber circuit in association with counter-electromotive force absorption from the inductive load when the switching means are turned off, is regenerated during subsequent turned-off period and turning-on action of the switching means. Additionally, transient voltage spikes are not applied to the switching means during turn-off because the counter-electromotive force is more quickly absorbed in comparison to prior art circuits.

17 Claims, 4 Drawing Sheets

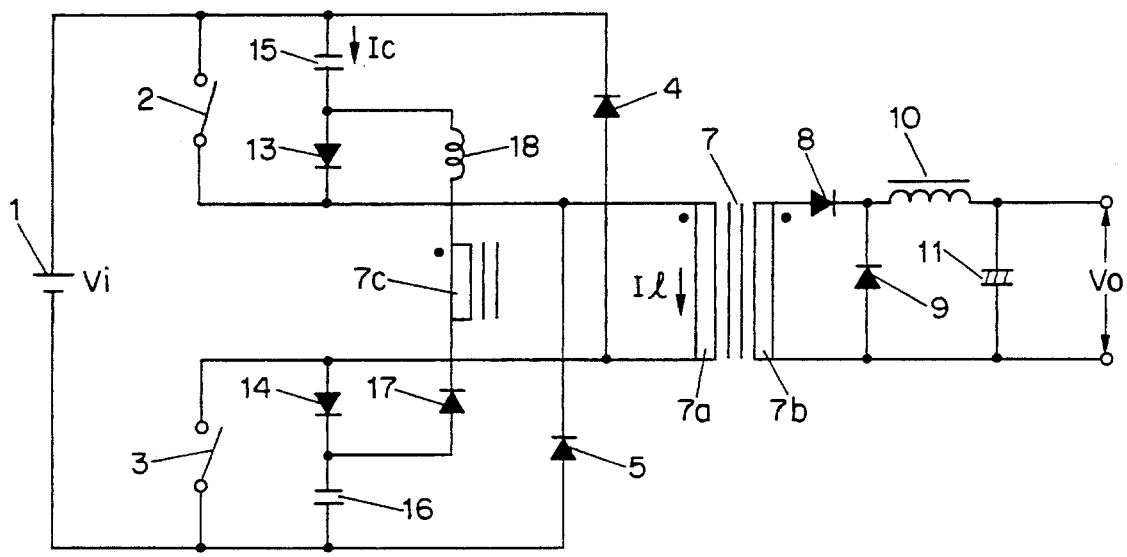
FIG. 1
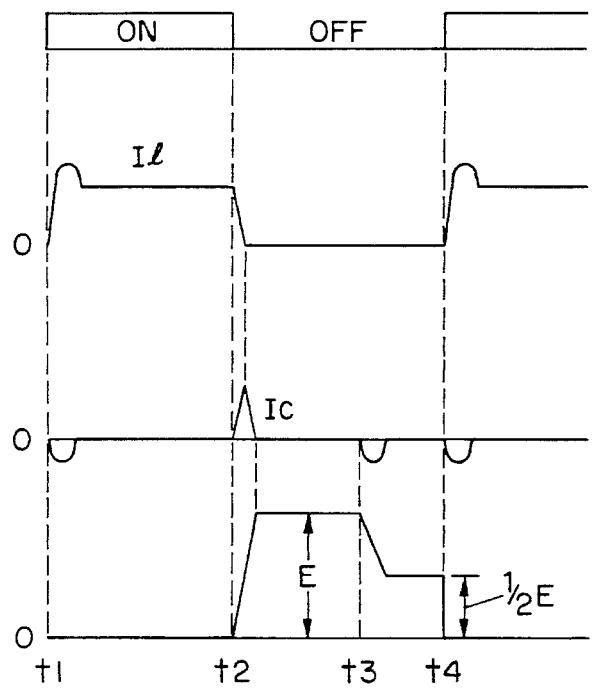

SNUBBER CIRCUIT FOR SWITCHING POWER SUPPLY

BACKGROUND OF THE INVENTION

The present invention relates to a switching power supply of two-transistor-forward type or two-transistor-flyback type which is cyclically connected and disconnected to an inductive load, e.g., a transformer, by switching means such as transistors, and more specifically to a snubber circuit of the switching power supply for absorbing counter-electromotive force generated from the inductive load when the switching means are turned off.

One method of obtaining rectified direct current output with desired voltage from a direct current power supply is to provide a switching power supply of two-transistor-forward type or two-transistor-flyback type with a transformer. The transformer is cyclically connected and disconnected to the direct current power supply by two switching means at a duty rate that sets output voltage of a primary coil of the transformer at a constant value. The switching power supply is provided with a snubber circuit for absorbing counter-electromotive force. Because recently developed transistors, which serve as the switching means, show very short turn-off time of 0.1μ sec, a very steep counter-electromotive force is generated from the transformer as an inductive load when the transformer is disconnected by turning off the transistors. The transient voltage spike can potentially damage the transistors. An example of the switching power supply that incorporates a prior art snubber circuit is shown in FIG. 7.

FIG. 7 shows a circuit diagram of a two-transistor-forward type switching power supply that is equipped with two transistors 2 and 3 acting as switching means, which transistors are represented by single-contact switches in the figure. In FIG. 7, the switching power supply generates a predetermined direct current output voltage Vo from a voltage Vi of a direct current power supply 1. Power is fed from the power supply 1 to a primary coil 7a of a transformer 7 for voltage transformation via transistors 2 and 3 which are turned on and off simultaneously at a duty rate corresponding to the output voltage Vo. An output circuit, connected to a secondary coil 7b of the transformer 7 which is in phase with the primary coil 7a, comprises a diode 8 for rectifying alternating voltage form the secondary coil 7b, a free-wheeling diode 9, a smoothing reactor 10, and a large capacity smoothing capacitor 11.

On the side of the primary coil 7a, diodes 4 and 5 which absorb excess counter-electromotive force generated when the transistors 2 and 3 are turning off, are connected between both ends of the primary coil 7a and both ends of the power supply 1 in a connection as shown in FIG. 7. When the counter-electromotive force exceeding the power supply voltage Vi is generated in the primary coil 7a, the diodes 4 and 5 become conductive to absorb the excess counter-electromotive force by regenerating the excess portion of the counter-electromotive force. However, the diodes 4 and 5 cannot immediately absorb the quickly rising counter-electromotive force from the primary coil 7a, which counter-electromotive force starts increasing around 0.1μ sec after the transistors 2 and 3 are turned off. The diodes 4 and 5 require a so-called forward recovery period of around 0.5μ sec, during which the diodes 4 and 5 are not conductive even if the voltage applied to the diodes 4 and 5 becomes inverted, i.e., the voltage applied to the diodes changes direction from reverse to forward.

To absorb the transient voltage spike, a snubber circuit 6, which incorporates a capacitor 61 and a resistor 62, is connected between the transistors 2 and 3 in parallel to the primary coil 7a. By employing the capacitor 61 of a large capacity and the resistor 62 of a small resistance, the counter-electromotive force present in the snubber circuit 6 immediately after the transistors 2 and 3 are turned off, are absorbed. Accordingly, the transistors 2 and 3 are protected from damage or break-down, and noise caused by the steep counter-electromotive force and fed to outside circuits may be suppressed, even when the slope or the peak value of the counter-electromotive force generated from the primary coil 7 is large.

The snubber circuit of FIG. 7 suffers from a characteristic turn-on loss of the transistors because a current flows through the snubber circuit not only when the transistors are turned off, but also when the transistors are turned on. In FIG. 7, when the transistors 2 and 3 are simultaneously turned on, a closed circuit is established between the terminals of the power supply 1 via the transistor 2, the capacitor 61, the resistor 62, and the transistor 3. Through this closed circuit, a large transient current flows, which current is limited only by the resistor 62, thereby causing turn-on loss of the transistors 2 and 3. This transient current is a charge-up current of the capacitor 61 of the snubber circuit 6, which current may be reduced by employing the capacitor 61 of small capacity and the resistor 62 of large resistance. However, application of this transient-current reduction scheme is quite limited because this transient-current reduction scheme substantially negates the snubber circuit's ability to absorb the counter-electromotive force.

When the transistors 2 and 3 are turned off, the counter-electromotive force generated in the primary coil 7a is absorbed by the snubber circuit 6. The energy of leakage inductance and wiring inductance of the primary coil 7a is stored by charging the capacitor 61, and the energy stored in the capacitor 61 is consumed in the resistor 62 during the turning-off period of the transistors 2 and 3. Thus, the resistor 62 is provided for consuming the energy stored in the capacitor 61 in response to charging and discharging of the capacitor 61. The energy that should be consumed at every charging/discharging cycle is proportional to the capacitance of the capacitor 61 and to the square of the charging voltage.

To improve the ability of the snubber circuit, capacitance of the capacitor should be increased, in accordance with which the-amount of energy that should be consumed in the resistor 62 increases. Since the aforementioned turn-on loss of the transistors 2 and 3, and the power loss in the resistor 62, increase in proportion to on-off switching frequency of the transistors 2 and 3, switching frequency increase of the transistors 2 and 3 causes increase in temperature of the resistor 62. Accordingly, the prior art snubber circuit is not suitable for high frequency switching.

It is an object of the present invention to provide a snubber circuit for a switching power supply which eliminates the turn-off and turn-on loss in the switching means and facilitates increased switching frequency.

SUMMARY OF THE INVENTION

The object of the present invention is achieved by a snubber circuit for a switching power supply that generates rectified direct current power from an inductive load cyclically connected and disconnected by two switching means fed by a direct current power supply. The snubber circuit according to the present invention absorbs counter-electromotive force generated during turn-off of the switching means. The snubber circuit incorporates two pairs of a capacitor and a diode, each capacitor-and-diode pair being connected in parallel to one of the switching means, and the capacitors also form a part of a series circuit including the direct current power supply. A voltage generating means is connected between the connection points of the capacitor and the diode in each of the two capacitor-and-diode pairs, and electromagnetically coupled to the inductive load, for generating surplus voltage to the charge-up voltage of the capacitors during on-period of the switching means. A diode is connected to the voltage generating means in a polarity configuration that prevents a current from flowing through the series circuit during off-period of the switching means.

In the switching power supply incorporating the snubber circuit described above, because energy is stored in the snubber circuit connected in parallel to the switching means by absorbing counter-electromotive force generated in the inductive load, no current flows through the snubber circuit, and the capacitors are not charged, when the switching means are turned on. Since a transient current that charges the capacitors of the snubber circuit does not flow through the switching means, except a current that the inductive load draws during turning-on action of the switching means, turn-on loss of the snubber circuit is reduced in comparison to the prior art snubber circuit.

When the switching means are turned off, the snubber circuit become conductive to absorb the counter-electromotive force that the inductive load generates and stores the leakage and the wiring inductance energy in the form of charge-up voltage in the capacitors. While the switching means are turning off, the voltage of the two capacitors is discharged until the voltage of the capacitors reaches the power supply voltage. The energy stored in the capacitors corresponding to the power supply voltage is discharged when the switching means start the next turn-on action.

Since it is necessary to increase the electromotive force in the snubber circuit to a level exceeding the power supply voltage for charging the power supply with energy, a voltage generating means is provided to the snubber circuit for generating surplus voltage in addition to the charge-up voltage of the capacitors. The voltage of the voltage generating means is so selected that sum of the voltage value of the voltage generating means and the charge-up voltage value of the capacitors exceeds the power supply voltage value. The energy discharged from the capacitors charges the power supply during turn-on period of the switching means.

The object of the present invention is also achieved by a snubber circuit of a switching power supply that incorporates in lieu of the voltage generating means a connecting-disconnecting means that is switched on and off simultaneously with the switching means. In the snubber circuit that incorporates a connecting/disconnecting means that is simultaneously switched on and off with the switching means, the leakage and wiring inductance energy stored in the capacitors in the form of the charge-up voltage is discharged through the connecting/disconnecting means when the switching means are turned on. Since the capacitors are charged to a voltage level substantially same as the power supply voltage, and since electromotive force of the snubber circuit becomes higher than the power supply voltage due to a resonance voltage between the capacitors and the snubber reactor, the capacitors are discharged during turn-on period of the transistors and the energy stored in the capacitors charges the power supply.

BRIEF DESCRIPTION OF THE DRAWINGS

FIG. 1 is a circuit diagram showing a first embodiment of a switching power supply according to the present invention.

FIG. 2 is a time chart showing characteristic wave forms of several portions of the circuit shown in FIG. 1.

DETAILED DESCRIPTION OF THE INVENTION

Figure 7:
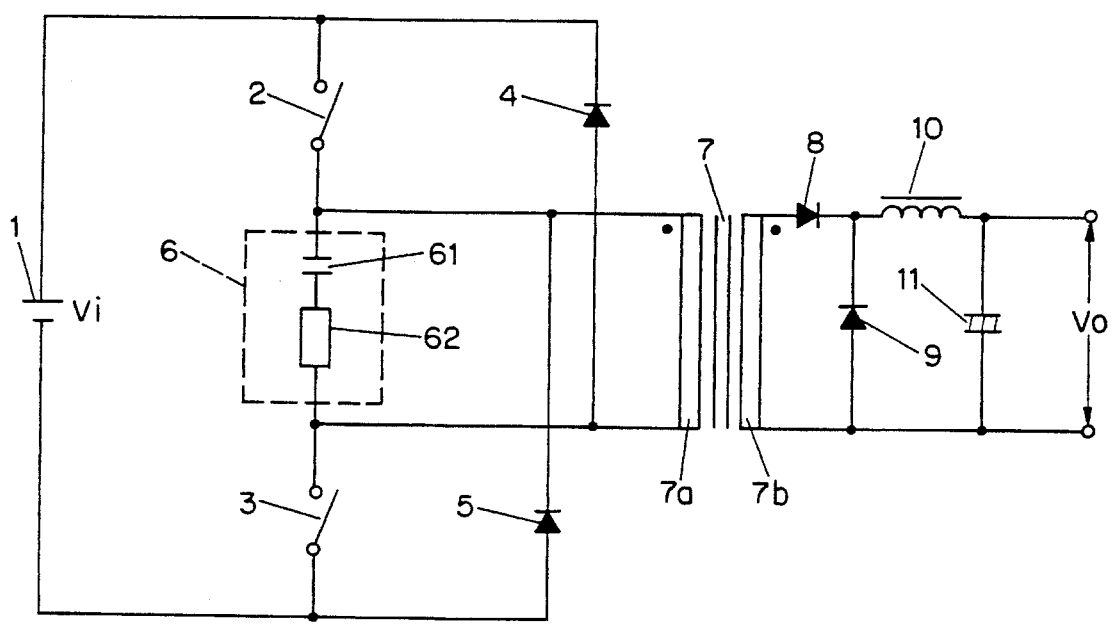
FIG. 7 is a circuit diagram showing a prior art switching power supply.

FIG. 1 is a circuit diagram showing an embodiment of a two-transistor-forward type switching power supply according to the present invention. In FIG. 1, components previously described in connection with the circuit shown in FIG. 7 are designated by the same reference numerals, and explanations of those components are omitted for simplicity. The switching power supply of FIG. 1 differs from the prior art switching power supply of FIG. 7 in that a snubber circuit consisting of a capacitor 15 and a diode 13 is connected in parallel to the transistor 2, and a snubber circuit consisting of a capacitor 16 and a diode 14 is connected in parallel to the transistor 3. The diodes 13 and 14 are connected in such polarity configuration that a current, caused by counter-electromotive force generated in the primary coil 7a of the transformer 7 when the transistors 2 and 3 are turned off, flows into the capacitors 15 and 16.

The switching power supply of FIG. 1 differs from the switching power supply of FIG. 7 also in that a series circuit, consisting of an auxiliary coil 7c of the transformer 7, a diode 17, and a snubber reactor 18 for suppressing regenerative current, is connected between the connection point of the capacitor 15 and the diode 13, and the connection point of the capacitor 16 and the diode 14.

Operation of the embodiment of FIG. 1 is explained hereunder with reference to FIG. 2, which illustrates characteristic time-wave forms of main portions of the switching power supply of FIG. 1. Since the transistors 2 and 3 are in an off state when the power supply 1 is connected to the switching power supply, a current flowing between the positive and negative terminals of the power supply 1 via the capacitor 15, the diode 13, the primary coil 7, the diode 14, and the capacitor 16, charges up the capacitors 15 and 16.

Since the capacitors 15 and 16 have already been charged when a turn-on command is fed to the transistors 2 and 3 at an instant t1 to turn on the transistors 2 and 3, as shown on time line (a) of FIG. 2, a current does not flow through the snubber circuit to reduce the turn-on loss of the transistors 2 and 3. Time line (b) of FIG. 2 shows the wave form of current I1 that flows through the transformer 7 via the capacitors 15 and 16. Time line (c) of FIG. 2 shows current Ic that flows through the capacitor 15, which current is representative of the currents flowing through the capacitors 15 and 16. When a current starts flowing through the coil 7a in response to turning-on action of the transistors 2 and 3, a regenerative current flows from the capacitor 15 in the opposite direction to the charge up current. The regenerative current flows from the capacitor 16 via the diode 17, the auxiliary coil 7c, and the snubber reactor 18. The regenerative current discharges the capacitors 15 and 16 to charge the power supply 1.

At an instant t2 of FIG. 2, when the command to the transistors 2 and 3 is switched from the on-command to an off-command and the transistors 2 and 3 are turned off, the current Il flowing through the primary coil 7a of the transformer 7 is quickly shut down, as shown on time line (b) of FIG. 2. In response to this, counter-electromotive force is generated in the primary coil 7a, the diodes 13 and 14 become conductive, and a charge-up current Ic flows to the capacitors 15 and 16 via the diode 13, the primary coil 7a, and the diode 14 to charge up the capacitors 15 and 16, as shown on time line (c) of FIG. 2.

By charging the capacitors 15 and 16, energy in the form of leakage inductance of the primary coil 7a and wiring inductance is transferred to, and stored in, the capacitors 15 and 16 in the form of charge-up voltage. Since the charge-up voltage of the capacitors 15 and 16 is applied in a reverse withstand voltage direction to the diodes 13 and 14, the capacitors 15 and 16 retain the absorbed energy without being discharged during the turn-off period of the transistors 2 and 3. Since the snubber circuit of the embodiment shown in FIG. 1 does not include any elements that correspond to the resistor 62 of FIG. 7, a time constant of counter-electromotive force absorption is so small that the counter-electromotive force is absorbed in the capacitors 15 and 16 shortly after its generation.

Time line (d) of FIG. 2 shows change in magnitude of a voltage applied to the transistors 2 and 3. As can be seen from time line (d) of FIG. 2, the applied voltage reaches a circuit voltage E, which is almost equal to Vi, as soon as the counter-electromotive force absorption in the snubber circuit is over, without rising steeply in response to the turning-off action of the transistors 2 and 3. Accordingly, the transistors 2 and 3 are protected from transient voltage spikes.

The auxiliary coil 7c of the transformer 7 in FIG. 1 generates voltage in phase with the primary coil 7a. The diode 17 is connected in a relative polarity configuration that prevents a current from flowing from the power supply 1. The auxiliary coil 7c is connected in series with the capacitors 15 and 16. When the transistors 2 and 3 are turned on, the voltage generated in the auxiliary coil 7c is added to the charge-up voltage of the capacitors 15 and 16. Since the auxiliary coil 7c is selected such that the sum of its voltage and the charge-up voltage of the capacitors 15 and 16 exceeds the power supply voltage Vi, at the instant when a current starts flowing through the primary coil 7a, as shown on time line (b) of FIG. 2, the regenerative current flows in the opposite direction to the charge-up current of the capacitors 15 and 16, as shown on time line (c) of FIG. 2. The capacitors 15 and 16 are discharged by the regenerative current and the energy stored in the capacitors 15 and 16 charges the power supply 1.

It is preferable to set the voltage generated in the coil 7c higher by a margin that will allow complete recovery of the energy stored in the capacitors 15 and 16. When this is the case, a small current flows through the primary coil 7a and the auxiliary coil 7c to the power supply 1. The small transient current is included in the current Il of the primary coil 7a in an early stage of the current Il that causes a small turn-on loss of the transistors 2 and 3, but this small turn-on loss is negligible. The snubber reactor 18 connected in series with the auxiliary coil 7c moderates steepness of increase of the transient current.

When the transistors 2 and 3 are turned off, the energy stored in the capacitors 15 and 16 is not fed to the power supply 1 because voltage is generated in the auxiliary coil 7c of the transformer 7 in an opposite polarity direction to the charge-up voltage of the capacitors 15 and 16. However, since the counter-electromotive force generated in the primary coil 7a exceeds the power supply voltage Vi when the voltage applied to the transistors 2 and 3 reaches the voltage level E, which is substantially the same as the power supply voltage Vi, as shown on time line (d) of FIG. 2, power regeneration is initiated by conduction of the diodes 4 and 5.

The diodes 4 and 5 cease conduction at an instance t3 when the counter-electromotive force generated in the primary coil 7a falls below the power supply voltage Vi, and the regeneration through the diodes 4 and 5 stops. Since, at this instance, energy corresponding to the power supply voltage Vi is stored in the capacitors 15 and 16, and the sum of the voltages of the capacitors 15 and 16 is 2Vi, a regenerative current flows to the power supply 1 via the capacitor 16, the diode 17, the auxiliary coil 7c, the snubber reactor 18, and the capacitor 15. This state is maintained until the transistors 2 and 3 are turned on after the voltage applied to the transistors 2 and 3 drops below 0.5E, or 0.5Vi.

Figure 3:
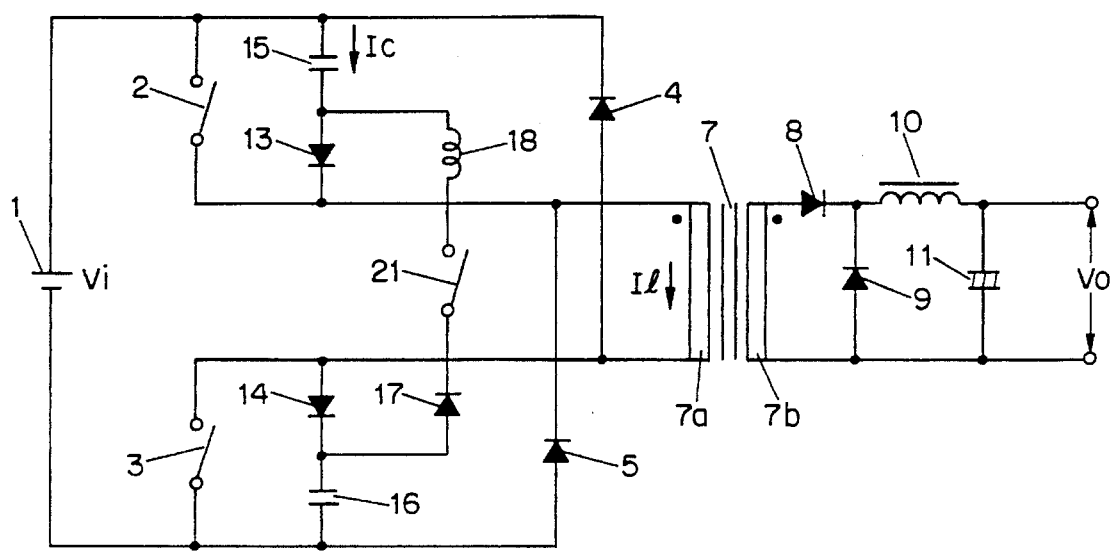
FIG. 3 is a circuit diagram showing a second embodiment of a switching power supply according to the present invention.

FIG. 3 is a circuit diagram showing another embodiment of a two-transistor-forward type switching power supply according to the present invention. In FIG. 3, components previously described in connection with the circuit shown in FIG. 1 are designated by the same reference numerals, and explanations of those components are omitted for simplicity.

In the first embodiment described in FIG. 1, when the transistors 2 and 3 are turned on, voltage is generated across the auxiliary coil 7c of the transformer 7, where the higher potential is at the top end of the coil 7c. The positive voltage causes a circulation current that flows from the auxiliary coil 7c and returns to the coil 7c via the snubber reactor 18, the diode 13, the primary coil 7a, the diode 14, and the diode 17. This circulation current causes increased loss in the transistors 2 and 3 when the transistors are turned on. The switching power supply of FIG. 3 solves this problem by substituting the auxiliary coil 7c of the transformer 7 with a transistor 21 that is turned on and off simultaneously with the transistors 2 and 3.

Figure 4:
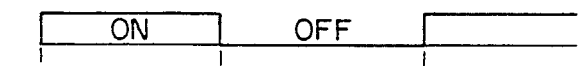
FIG. 4 is a time chart showing characteristic wave forms of several portions of the circuit shown in FIG. 3.
Figure 4:
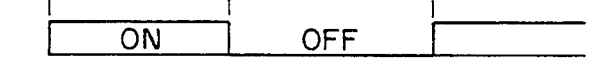
Figure 4:
Figure 4:
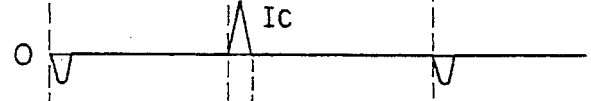
Figure 4:
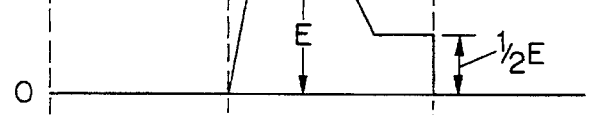
Figure 4:
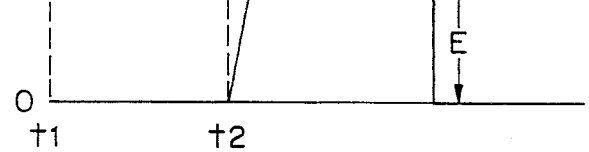

Operation of the embodiment of FIG. 3 is explained hereunder in conjunction with FIG. 4 that illustrates characteristic time wave forms of main portions of the switching power supply of FIG. 3. Since the transistors 2 and 3 are in an off state, when the power supply is connected to the switching power supply, the capacitors 15 and 16 are charged by the charge-up current that flows from the positive terminal of the power supply 1 to the negative terminal of the power supply 1 via the capacitor 15, the diode 13, the primary coil 7a, the diode 14 and the capacitor 16.

Since the capacitors 15 and 16 have already been charged up when a turn-on command is fed to the transistors 2 and 3 at an instant t1 to turn on the transistors 2 and 3, as shown on time line (a) of FIG. 4, no current flows through the snubber circuit to reduce the turn-on loss of the transistors 2 and 3, similar to the operation of the first embodiment shown in FIG. 1. However, in the second embodiment shown in FIG. 3, the transistor 21 is simultaneously turned on at the moment t1, and the leakage and the wiring inductance energy stored in the capacitors 15 and 16 in the form of the charging voltage is regenerated and fed to the power supply 1, which process is explained below in further detail.

At an instant t2 on the time line (a) of FIG. 4, when the command to the transistors 2 and 3 is switched to an off-command and the transistors 2 and 3 are turned off, the current I1 flowing through the primary coil 7a of the transformer 7 is quickly shut down, as shown on time line (b) of FIG. 4. In response to this, a counter-electromotive force is generated in the primary coil 7a. At the same time, the transistor 21 is turned off, as shown on time line (e) of FIG. 4, and the capacitors 15 and 16 are charged up to a voltage level E, which is substantially same as the power supply voltage Vi, through a current path between the capacitor 15 and the capacitor 16 via the diode 13, the primary coil 7a, and the diode 14. The wave forms of the charge-up current Ic and the voltage across the capacitors 15 and 16 are shown on time lines (c) and (f) of FIG. 4, respectively.

By the charging the capacitors 15 and 16, energy in the form of leakage inductance of the primary coil 7a and wiring inductance is transferred to, and stored in, the capacitors 15 and 16 in the form of charge-up voltage. The energy stored in the capacitors 15 and 16 is retained in the capacitors while the transistors 2, 3 and 21 are in an off state, and discharged to be regenerated when the transistors 2, 3 and 21 are turned on at the instant t4. Since the capacitors 15 and 16 are charged to the voltage level E, which is substantially same as the power supply voltage Vi, and since electromotive force of the snubber circuit becomes higher than the power supply voltage due to a resonance voltage between the capacitors 15, 16 and the snubber reactor 18, the capacitors 15 and 16 are discharged while the transistors 2 and 3 are in on state and the energy stored in the capacitors 15 and 16 is transferred to the power supply 1.

By replacing the auxiliary coil 7c of the first embodiment shown in FIG. 1 with the transistor 21 in the second embodiment, the second embodiment eliminates losses caused by the circulation current that would otherwise flow from the auxiliary coil 7c and return to the auxiliary coil 7c via the snubber reactor 18, the diode 13, the primary coil 7a, the diode 14 and the diode 17.

The diode 17 is not essential for the embodiment of FIG. 3 since the transistor 21 is turned off when the transistors 2 and 3 are turned off. However, the diode 17 is effective for preventing the snubber circuit form becoming conductive when time lag exists between the on-off actions of the transistor 21 and the transistors 2 and 3.

Figure 5:
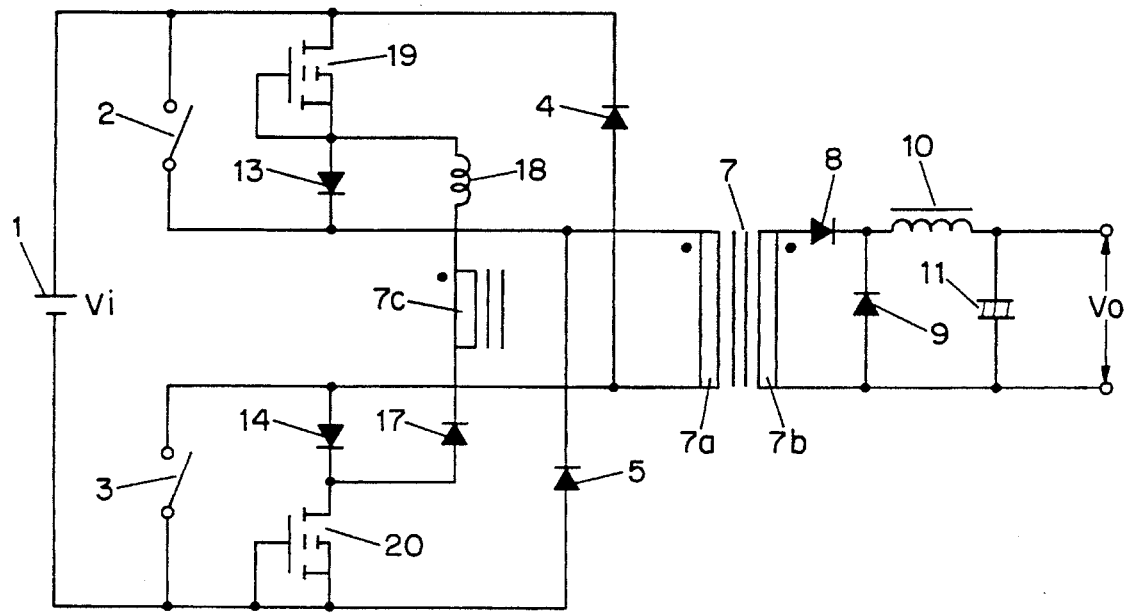
FIG. 5 is a circuit diagram showing a third embodiment of a switching power supply according to the present invention.
Figure 6:
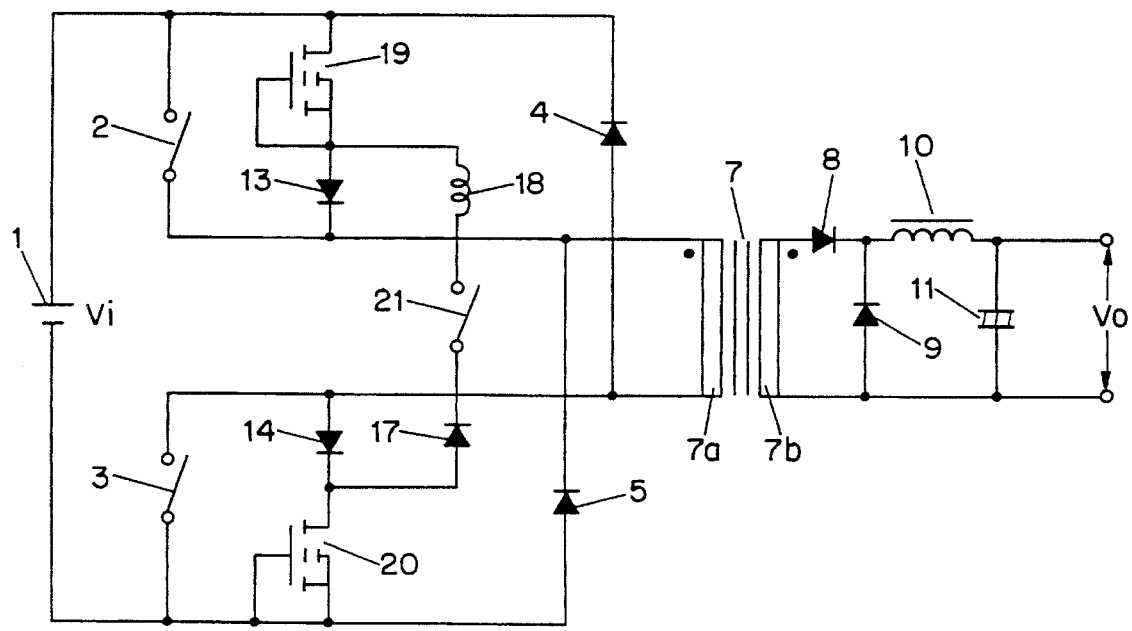
FIG. 6 is a circuit diagram showing a fourth embodiment of a switching power supply according to the present invention.

FIGS. 5 and 6 are circuit diagrams showing two other embodiments of a two-transistor-forward type switching power supply. In FIGS. 5 and 6, components previously described in connection with the circuit shown in FIG. 1 are designated by the same reference numerals, and explanations of those components are omitted for simplicity.

The embodiments of FIGS. 5 and 6 are provided with n-channel MOSFETs 19 and 20 in place of the capacitors 15 and 16. The drain of the MOSFET 19 is connected to the positive terminal of the power supply 1, and the MOSFET's source and gate are connected in common to the diode 13. The drain of the MOSFET 20 is connected to a cathode of the diode 14, and the MOSFET's source and gate are connected in common to the negative terminal of the power supply 1. Drain-source output capacity Coss and drain-gate feed back capacity Crss of the MOSFETs 19 and 20 are about 3,000 pF when the MOSFETs' drain-source voltage is zero. Coss and Crss decrease with increasing drain-source voltage, the Coss decreasing to about 250 pF and the Crss decreasing to about 100 pF when the drain-source voltage is 30 V.

The embodiments of FIGS. 5 and 6 utilize the drain-source voltage dependence of the Coss and Crss of the MOSFETs 19 and 20 in that the Coss and Crss are large when the drain-source voltage is low and the Coss and Crss are small when the drain-source voltage is high. Since operation of the embodiments of the switching power supply of FIG. 5 and 6 are substantially same as that of the embodiments of FIGS. 1 and 3, explanation will be focused on the action of the MOSFETs 19 and 20 which depends on the drain-source voltage when the transistors 2 and 3 are switched from on to off state.

In FIGS. 5 and 6, voltage applied between the drain and the source of the MOSFETs 19 and 20 is 0V when the transistors 2 and 3 are turned on, and the Coss and Crss of the MOSFETs are large. In response to turning off of the transistors 2 and 3, counter-electromotive force is generated in the primary coil 7a, and a charge-up current flows to the MOSFETs 19 and 20 via diodes 4 and 5. The energy stored in the MOSFETs 19 and 20 in the form of drain-source voltage is calculated by dividing the charge-up current by the capacitance of the capacitor. Because the capacitance of the capacitors of the embodiments are large, the drain-source voltage rises along a curve that has a lower slope than a straight line along which the drain-source voltage rises when a usual capacitor of constant capacity is charged. Thus, the turn-off loss of the transistors 2 and 3 is reduced.

Although the applicants' invention has been described in connection with the above-described embodiments of two-transistor-forward type switching power supply, those skilled in the art will readily appreciate that the embodiments may be modified in many respects and nonetheless enjoy the advantages provided by the invention. For example, the snubber circuits of the present invention are adaptable also to the two-transistor-flyback type switching power supply.

We claim:

1. A snubber circuit for a switching power supply that incorporates two switching means for cyclically connecting and disconnecting an inductive load to a direct current power supply, said snubber circuit comprising:

a first pair of a first capacitor and a first diode connected in series, said first capacitor-and-diode pair being connected in parallel to a first of said two switching means;

a second pair of a second capacitor and a second diode connected in series, said second capacitor-and-diode pair being connected in parallel to a second of said two switching means;

a voltage generating means having its first terminal ultimately connected to a connection point of said first capacitor with said first diode, and its second terminal ultimately connected to a connection point of said second capacitor with said second diode, said voltage generating means being electromagnetically coupled to said inductive load; and a third diode connected between said second capacitor and said second terminal of said voltage generating means, wherein said third diode forms a portion of a series circuit comprising said voltage generating means and said third diode, and said third diode being connected in a polarity configuration that prevents a current from flowing through said series circuit during off-period of said two switching means.

2. The snubber circuit as claimed in claim 1, wherein said inductive load comprises a primary coil of a transformer and said voltage generating means comprises an auxiliary coil of said transformer for inducing voltage in the same direction as said primary coil.

3. The snubber circuit as claimed in claim 2, wherein said two switching means are transistors.

4. The snubber circuit as claimed in claim 1, wherein said two switching means are transistors.

5. The snubber circuit as claimed in claim 1, further comprising a snubber reactor connected between said first capacitor and said first terminal of said voltage generating means.

6. The snubber circuit as claimed in claim 5, wherein said inductive load comprises a primary coil of a transformer and said voltage generating means comprises an auxiliary coil of said transformer for inducing voltage in the same direction as said primary coil.

7. The snubber circuit as claimed in claim 6, wherein said two switching means are transistors.

8. The snubber circuit as claimed in claim 5, wherein said two switching means are transistors.

9. A snubber circuit for a switching power supply that incorporates two switching means for cyclically connecting and disconnecting an inductive load to a direct current power supply, said snubber circuit comprising:

a first pair of a first transistor and a first diode connected in series, said first transistor-and-diode pair being connected in parallel to a first of said two switching means;

a second pair of a second transistor and a second diode connected in series, said second transistor-and-diode pair being connected in parallel to a second of said two switching means;

a voltage generating means having its first terminal ultimately connected to a connection point of said first transistor with said first diode, and its second terminal ultimately connected to a connection point of said second transistor with said second diode, said voltage generating means being electromagnetically coupled to said inductive load; and a third diode connected between said second transistor and said second terminal of said voltage generating means, wherein said third diode forms a portion of a series circuit comprising said voltage generating means and said third diode, and said third diode being connected in a polarity configuration that prevents a current from flowing through said series circuit during off-period of said two switching means.

10. A snubber circuit as claimed in claim 9, wherein said two switching means comprise a third transistor and a fourth transistor.

11. The snubber circuit as claimed in claim 10, wherein said inductive load comprises a primary coil of a transformer and said voltage generating means comprises an auxiliary coil of said transformer for inducing voltage in the same direction as said primary coil.

12. The snubber circuit as claimed in claim 11, further comprising a snubber reactor connected between said first capacitor and said first terminal of said voltage generating means.

13. The snubber circuit as claimed in claim 12, wherein said first and second transistors are MOSFETs.

14. A snubber circuit for a switching power supply that incorporates two switching means for cyclically connecting and disconnecting an inductive load to a direct current power supply, said snubber circuit comprising:

a first pair of a first transistor and a first diode connected in series, said first transistor-and-diode pair being connected in parallel to a first of said two switching means;

a second pair of a second transistor and a second diode connected in series, said second transistor-and-diode pair being connected in parallel to a second of said two switching means;

a connecting/disconnecting means having its first terminal ultimately connected to a connection point of said first transistor with said first diode, and its second terminal ultimately connected to a connection point of said second transistor with said second diode;

a snubber reactor connected between said first transistor and said first terminal of said connecting/disconnecting means; and a third diode connected between said second transistor and said second terminal of said connecting/disconnecting means, said connecting/disconnecting means forming, when connected, a portion of a series circuit comprising said snubber reactor, said connecting/disconnecting means and said third diode, and said third diode being connected in a polarity configuration that prevents a current from flowing through said series circuit during off-period of said switching means;

wherein said connecting/disconnecting means is switched on and off synchronously with said two switching means.

15. The snubber circuit as claimed in claim 14, wherein said inductive load comprises a primary coil of a transformer and said connecting/disconnecting means comprises a third transistor.

16. The snubber circuit as claimed in claim 15, wherein said two switching means comprise a fourth transistor and a fifth transistor.

17. The snubber circuit as claimed in claim 16, wherein said first and second transistors are MOSFETs.

* * * * *

UNITED STATES PATENT AND TRADEMARK OFFICE
CERTIFICATE OF CORRECTION

PATENT NO. : 5,548,503
DATED : August 20, 1996
INVENTOR(S) : Motonobu et al.

It is certified that error appears in the above-indentified patent and that said Letters Patent is hereby corrected as shown below: On the title page
  item [73]  "Hino" should read --Tokyo--.

Signed and Sealed this

Eleventh Day of February, 1997

Attest:

BRUCE LEHMAN

Attesting Officer       Commissioner of Patents and Trademarks